United States Patent [19]

Burke

[11] 4,455,664
[45] Jun. 19, 1984

[54] CARRIER DATA OPERATED SQUELCH

[75] Inventor: Timothy M. Burke, Fort Worth, Tex.

[73] Assignee: Motorola Inc., Schaumburg, Ill.

[21] Appl. No.: 328,360

[22] Filed: Dec. 7, 1981

[51] Int. Cl.³ .............................................. H03K 6/04
[52] U.S. Cl. .................................... 375/104; 455/218
[58] Field of Search ................... 330/150; 375/104, 5, 375/75; 455/212, 218, 219, 221, 225

[56] References Cited

U.S. PATENT DOCUMENTS

| | | |
|---|---|---|
| 3,472,960 | 10/1969 | Gutleber et al. . |
| 3,509,471 | 4/1970 | Puente .................................. 328/55 |
| 3,518,680 | 6/1970 | McAuliffe . |
| 3,535,452 | 10/1970 | Oswald . |
| 3,671,776 | 6/1972 | Houston . |
| 3,778,550 | 12/1973 | David et al. . |
| 3,939,431 | 2/1976 | Cohlman ............................. 455/221 |
| 3,978,285 | 8/1976 | Tan et al. . |
| 3,984,777 | 10/1976 | Noguchi . |
| 4,004,090 | 1/1977 | Goto et al. . |
| 4,017,798 | 4/1977 | Gordy et al. . |
| 4,035,727 | 7/1977 | Ishii . |
| 4,059,805 | 11/1977 | de Laage de Meux et al. ..... 329/50 |
| 4,064,361 | 12/1977 | Kustka et al. . |
| 4,079,329 | 3/1978 | England et al. ....................... 329/50 |
| 4,197,502 | 4/1980 | Sumner et al. ........................ 375/75 |
| 4,218,769 | 8/1980 | Cagle ..................................... 375/95 |
| 4,229,822 | 10/1980 | Bench .................................... 375/81 |
| 4,234,957 | 11/1980 | Tracey et al. .......................... 375/86 |
| 4,344,175 | 8/1982 | Leslie ...................................... 375/5 |

*Primary Examiner*—Benedict V. Safourek
*Attorney, Agent, or Firm*—F. John Motsinger; James W. Gillman

[57] ABSTRACT

A unique carrier data operated squelch for use with a demodulator detector for phase shift keyed digital signals. The counts transitions in the PSK signal by examining a narrow time window around the phase transitions. The number of data transitions that fall inside and outside the window is correlated with a predetermined threshold. The inventive carrier squelch permits parameter programmability and is particularly suitable for implemenation utilizing a microprocessor.

10 Claims, 10 Drawing Figures

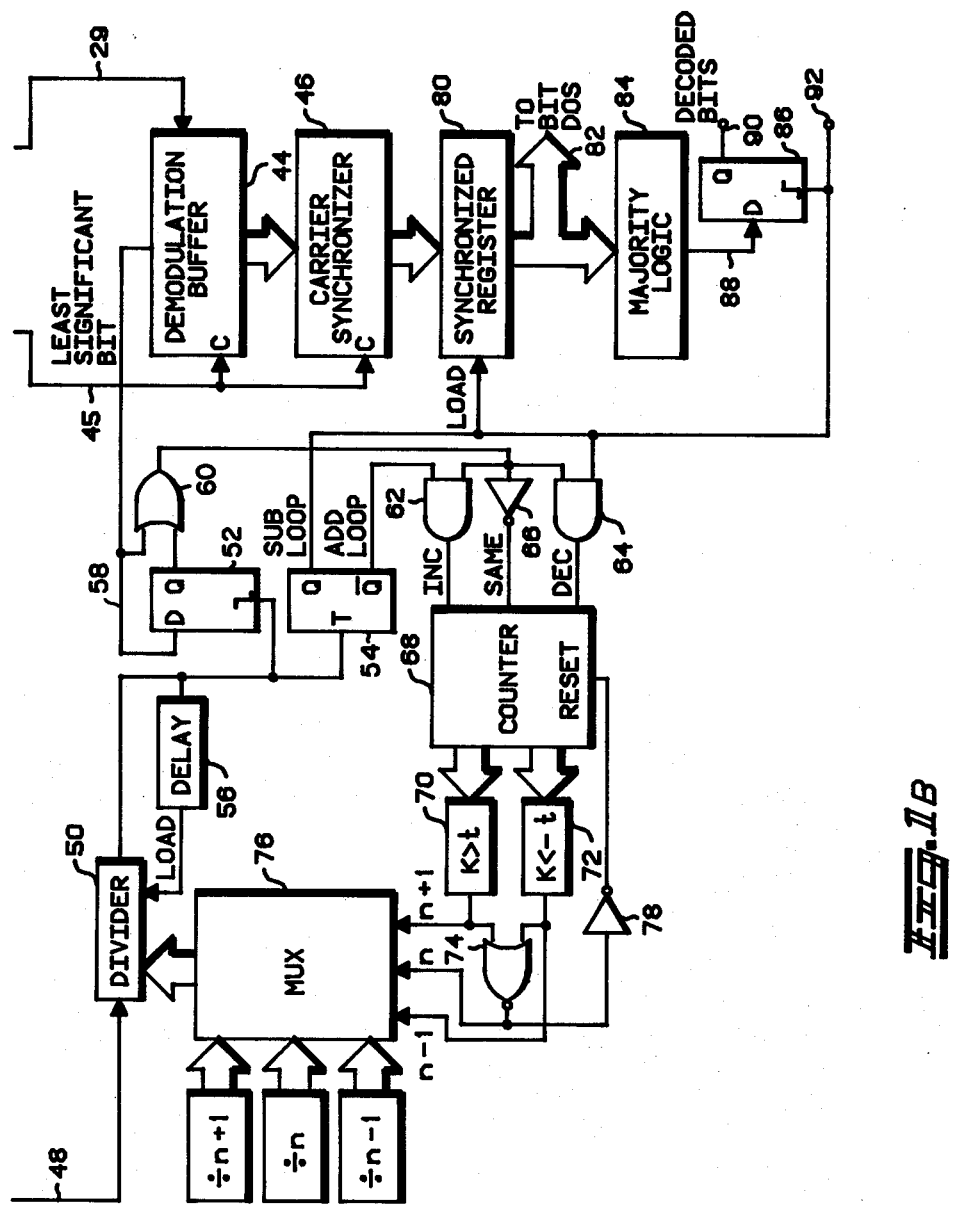

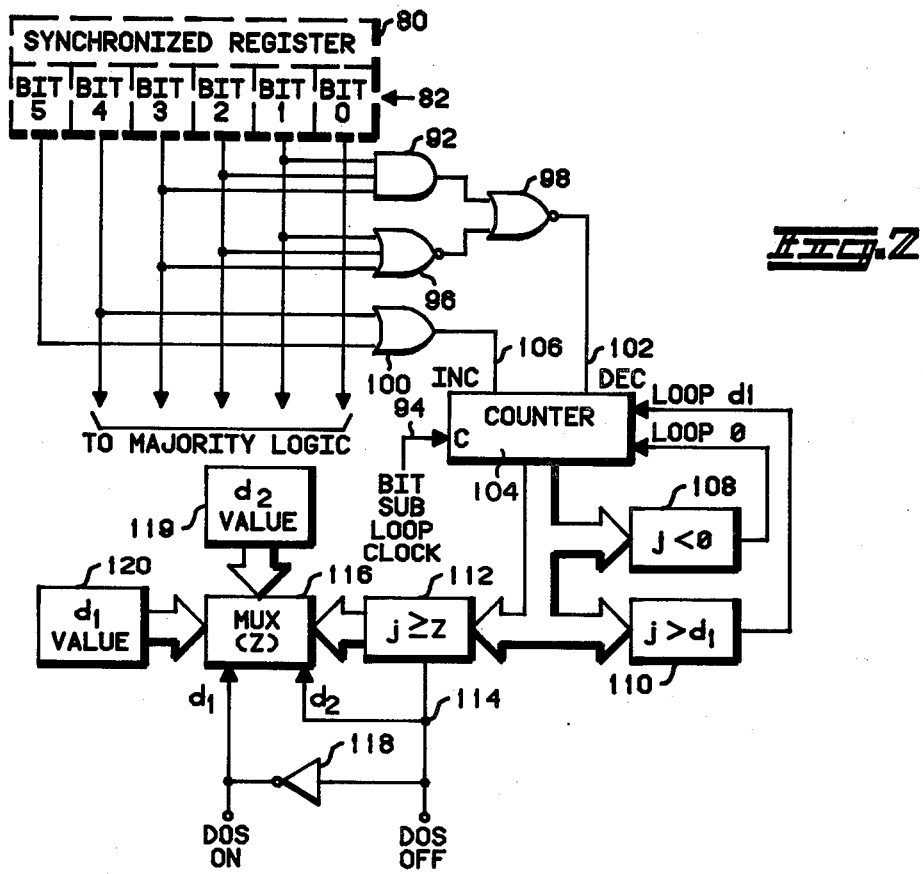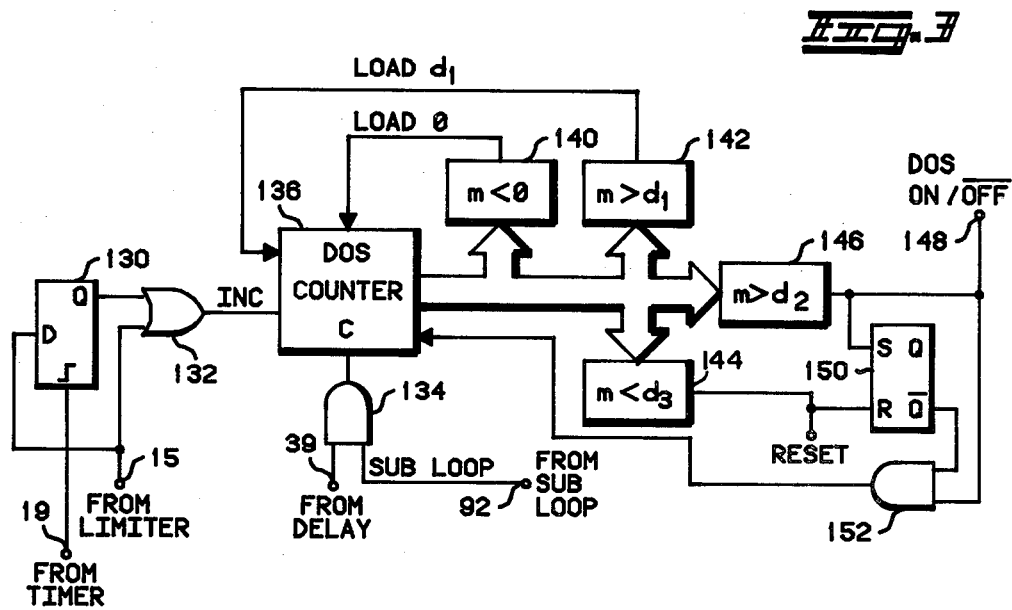

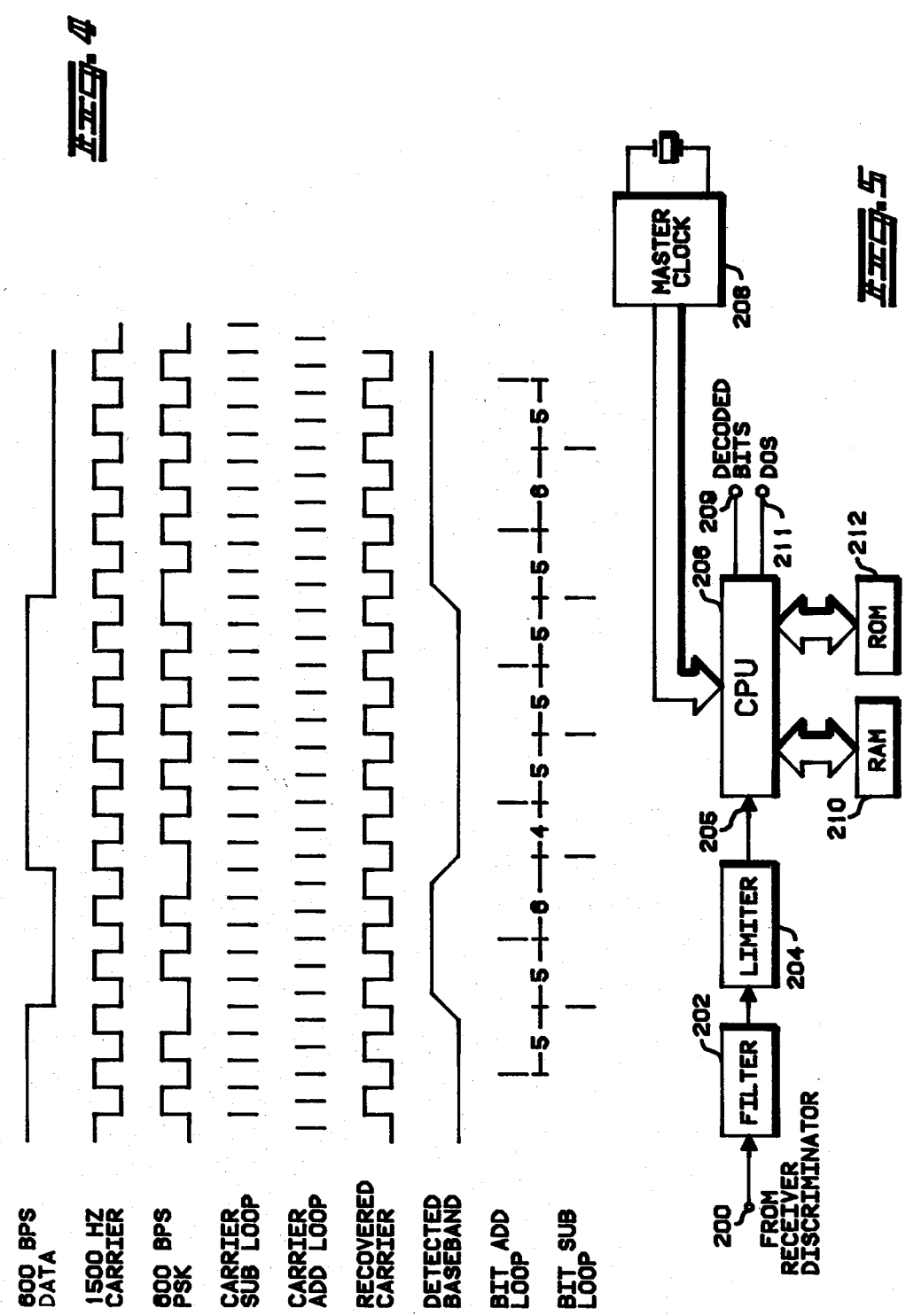

CARRIER DATA OPERATED SQUELCH

BACKGROUND OF THE INVENTION

1. Field of the Invention

This invention relates generally to data communication systems and more particuarly to digital apparatus and method for a carrier data operated squelch.

2. Description of the Prior Art

Phase shift keyed (PSK) modulation techniques are widely used in digital signalling over RF communication channels. In digital phase shift keying, digital information is communicated over the channel by sequentially transmitting carrier pulses of constant amplitude, angular frequency and duration but of different relative phase. Demodulation of PSK signals is accomplished by detecting the relative phase of the incoming signal and using the phase information obtained to determine the data content of the modulated signal. Present PSK demodulator systems generally employ hybrid arrangements of digital and analogue circuit components. Such PSK demodulators generally require on-site calibration and periodic readjustment.

Many of these problems can be solved by utilizing a digital sampling board phase locked loop method for PSK demodulation and detection. With such systems it is often desirable to provide squelch capability based upon carrier data detection to permit audio muting or data steering functions. Prior art circuits for carrier detection required complex circuitry with fixed parameters and were unduly expensive to manufacture.

SUMMARY OF THE INVENTION

Accordingly, it is an object of the invention to provide an improved carrier data operated squelch for PSK systems utilizing digital sampling and a PLL demodulation and detector.

It is another object of the invention to provide an improved carrier operated squelch for PSK signals which is parameter programmable for various data rate and carrier frequencies.

It is yet another object of the invention to provide a digital carrier operated squelch.

It is a further object of the invention to provide an improved digital carrier operated squelch which is particularly suitable for implementation using a microprocessor.

Briefly, according to the invention, a carrier data operated squelch circuit is provided for user with a demodulator detector for phase shift keyed (PSK) encoded digital signals, which provides carrier clock pulses synchronized to the carrier and bit clock pulses synchronized to the edge of the bits of the digital signal. The squelch circuit includes limiting circuitry to hard limit the PSK encoded digital signal, coupled to an early sampling means for storing an early sample of the limited signal. A transition detector is coupled to the limiting circuit and the early sampling circuit to generate a transition signal if the present limited signal is different from the stored early sample. Delay circuitry provides delayed carrier clock pulses delayed from the carrier clock pulses by a predetermined time interval. A counter is coupled to the transition detector for accumulating a count by incrementing in response to a transition signal and a bit clock pulse occurring concurrently with a delayed carrier clock pulses, and by decrementing in response to the absence of a transition signal when a bit clock pulse occurs concurrently with a delayed carrier clock pulse. A comparator is coupled to the counter means for generating a squelch control signal in response to the count exceeding a predetermined threshold.

BRIEF DESCRIPTION OF THE DRAWINGS

The features of the present invention which are believed to be novel are set forth with particularity in the appended claims. The invention, together with further objects and advantages thereof, may best be understood by reference of the following description when taken in conjunction with the accompanying drawings.

FIG. 1B is a detailed block diagram of the bit recovery portion of a digital demodulatin and detector compatible with the present invention.

FIG. 2 is a detail block diagram of a data operated squelch circuit compatible with the present invention.

FIG. 3 is a detail block diagram of a carrier data operated squelch circuit embodying the present invention.

FIG. 4 is an illustration of the waveforms of the modulated and demodulated data for the digital demodulator and detector of FIGS. 1A and 1B and 5.

FIG. 5 is a block diagram illustrating a microprocessor implementation of the preferred embodiment of the invention.

DETAILED DESCRIPTION OF THE INVENTION

Figure 1A:
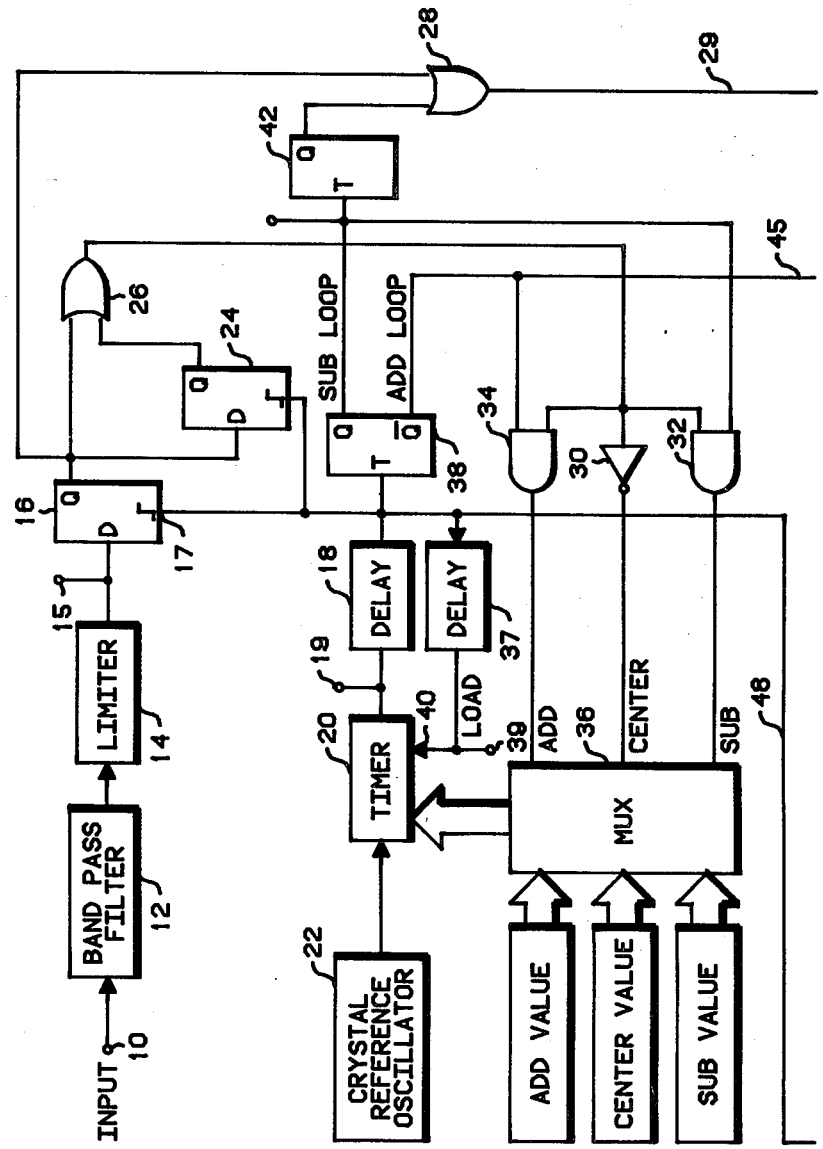
FIG. 1A is a detail block diagram of the carrier recovery portion of a digital demodulator and detector compatible with the present invention.

In FIG. 1A there is illustrated the carrier recovery section of a digital PSK demodulation and detector compatible with the invention. The digital demodulator and detector may be advantageously utilized in a PSK signal receiver. The PSK signal may be a serial digital signal such as that shown in FIG. 4. The PSK signal may be generated with a carrier frequency of 1500 Hz and at a bit rate of 600 Hz. Thus, each bit of the digital signal is comprised of 2½ cycles (i.e. five half cycles) of the carrier signal.

A PSK signal is coupled from the receiver descriminator (not shown) to the input 10 of the carrier digital PSK demodulator and detector of FIG. 1A and is bandpass filtered by a bandpass filter 12, as shown. The resulting signal is squared-up by a limiter 14 and coupled to a sampler 16, where the squared-up PSK signal is sampled at essentially four times the carrier frequency (i.e., 6 Kilohertz in the preferred embodiment). The sampler 16 is controlled by sampling pulses coupled, as shown, through a delay circuit 18 from a sampling timer 20 to the control input 17 of the sampler 16. The sampling timer 20 generates the sampling pulses at the required rate by dividing a clock signal coupled from a reference oscillator 22. The sampler 16 takes a sample at the positive edge of the sampling pulse applied to the control input 17 and couples the sample from the Q output of the sampler 16 to the D input of a second sampler 24 and to one input of exclusive OR gates 26 and 28, as shown. The sampling pulse coupled from the sampling timer 20 is coupled to the control input of the sampler 24 such that the sampler 24 takes a sample on the negative edge of the sampling pulse. This results in storing the existing sample in the sampler 16 so that a new sample taken by sampler 16 can be compared to the previous sample in sampler 24 by the exclusive OR gate 26. The stored sample in sampler 24 is coupled to the second input of the exclusive OR gate 26 which serves as a difference detector generating a high output whenever the two inputs are different. The output of the exclusive OR gate 26 is coupled to an inverter 30 and to AND gates 32 and 34, as shown. The AND gates 32 and 34 are therefore enabled by a high output from the exclusive OR gate 26. The outputs of the inverter 30 and the AND gates 32 and 34 are coupled, as shown, to a multiplexer 36. In addition, the sampling pulse from the sampling timer 20 is coupled through the delay circuit 18 to the T input of a T flip-flop 38 such that the T flip-flop toggles the Q and $\bar{Q}$ outputs at each sample pulse. The Q output of the flip-flop 38 is coupled, as shown, to the second input of the AND gate 32 and the $\bar{Q}$ output of the flip-flop 38 is coupled to the second input of the AND gate 34.

The multiplexer 36 is coupled to the sample counter 20 such that one of three values, an add, center, or subtract value is loaded into the timer 20 by a delayed pulse coupled through the delay circuit 18 and 39 to the load input 40 of the sample timer 20. The value coupled by the multiplexer 36 to the timer 20 is determined by the signals coupled from the AND gates 32 and 34 and the output from the invertor 30. Thus, if the samples in the sampler 16 and 24 are identical the output of the exclusive OR gate 26 will be zero disabling the AND gates 32 and 34 and resulting in a high output from the inverter 30 coupled to the multiplexer. This results in a center frequency value being loaded into the sample timer such that the sample timer provide sample pulse at a center frequency (6 Khz in the preferred embodiment) because no edge has occurred between the input samples. If, however, the two samples from sampler 16 and 24 are different than the output of the exclusive OR gate 26 will be high meaning a transition has occurred between the two samples. This high output from the exclusive OR gate 26 will thereby enable the AND gates 32 and 34. If the toggle flip-flop 38 is such that the Q output is high (i.e., the add loop) then a high output will be generated at the oput of AND gate 34 causing the multiplexer to couple the add value to the sample timer. This causes a small increase in the center frequency pulse time interval resulting in a correction of the timing pulses. If the toggle flip-flop 38 $\bar{Q}$ output is high (i.e., the sub-loop) then a high is coupled to the AND gate 32 resulting in a high output from the AND gate 32 coupled to the multiplexer 36 causing a subtract value to be coupled to the timer 20. This results in a small amount of time being subtracted from the center frequency time interval of the sample timer, again resulting in a small timing correction. A phase/frequency locking action is thereby provided which causes the add loop samples to be in the middle of the carrier half cycle and the subtract loop samples to be near the edge as illustrated in FIG. 4. The result of this locking action is that this phase lock loop structure locks to the local carrier, where the bandwidth of the loop is determined by the amount of time correction (which is the preferred embodiment is 8.33 $\mu$sec. yielding a bandwidth of $\pm 75$ Hz since $B = \pm 4X^2T_c$ where B is the bandwidth in Hz, X is the carrier frequency and $T_c$ is the time correction in seconds). Thus, the subtract loop pulses from the toggle flip-flop 38 when coupled through the toggle flip-flop 42 as shown results in a recovered carrier such as that illustrated in FIG. 4 at the Q output of the flip-flop 42. This recovered carrier is coupled to the exclusive OR gate 28 which mixes the carrier signal with the sample output of the sampler 16 producing a demodulated baseband output, such as that illustrated in FIG. 4 at the output of the exclusive OR gate 28. This demodulated baseband signal is then coupled via the conductor 29 to the input of a demodulation buffer 44 shown in FIG. 1B. The Q output of the flip-flop 38 is also coupled via a conductor 45 to the clock input of the demodulation buffer 44 in addition to being coupled to the clock input of the carrier synchronizer shift register 46 as shown in FIG. 1B.

The phase locked sample pulses from the timer 20 are also coupled via a conductor 48 through the delay circuit 18 to the input of a programmable divider 50 (e.g. programmable down counter) of Fig. 1B. This divider serves as the timer for the bit detection loop of the demodulation and detection circuit as shown in FIG. 1B. Thus the timing for the bit detection loop is derived from the sample timing pulses. The divider 50 output, in the preferred embodiment, is at two times the bit rate. The bit detection loop is basically the same type of phase lock loop used for the demodulation with the subtract cycle being near the edge of the bit and the add cycle being near the middle of the bit, as shown in FIG. 4.

The timing pulses from the output of the divider 50 are coupled to the control input of the sampler 52, the T input of a toggle flip-flop 54, and through a delay circuit 56 to the load input of the divider 50, as shown. The least significant bit of the demodulation buffer 44 is coupled via a conductor 58 to the D input of the sampler 52 and one input of an exclusive OR gate 60, as shown. In addition, the Q output of the sampler 52 is coupled to the second input of the exclusive OR gate 60. Thus the sampler 52 stores the contents of the least significant bit of the demodulation buffer 44 upon the negative edge of the timing pulse. This stored value is compared to the current value of the demodulation buffer 44 by the exclusive OR gate 60, and the high output is generated if they are different. Thus the exclusive OR gate 60 functions as a phase difference detector, thereby detecting the occurrence of a transition. The output of the exclusive OR gate 60 is coupled to AND gates 62 and 64, and to an inverter 66, as shown. In addition, the timing pulses toggle the flip-flop 54 from the subtract state when the Q output is high, to the add state when the $\bar{Q}$ output is high. The Q output of the flip-flop 54 is coupled to the AND gate 64 and the $\bar{Q}$ output is coupled to the AND gate 62, as shown. Thus an appropriate correction signal is coupled from the exclusive OR gate 60 through the gate 62, 64 or the invertor 66 to a transition counter 68. The transition counter 68 provides a flywheel effect by requiring an accumulation of a predetermined number (t) of subtract or add signals before a correction is made. Thus the transition counter 68 is incremented for signals from the AND gate 62 and decremented for signals from AND gate 64 and stays the same for a signal from the inverter 66. If the accumulated total in the counter 68 reaches the positive predetermined threshold (t), then a comparator 70 produces a high output, and if the accumulator total reaches a negative threshold (−t), a high is generated at the output of a comparator 72, coupled to the counter 68, as shown. The output of the comparator 70 is coupled to the N+1 input (where N equals the number of half cycles per bit which in the preferred embodiment is 5) of a multiplexer 76 as well as to an NOR gate 74, and the output of the comparator 72 is coupled to the N−1 input of the multiplexer 76 and to the NOR gate 74, as shown. The output of the NOR gate is coupled to the N input of the multiplexer 76 and through an inverter 78 to the reset of the counter 68. Thus a high output from the comparator 70 will cause the multiplexer 76 to couple the N+1 value to the divider 50, and a high from the output of the comparator 72 will cause the multiplexer 76 to couple the N−1 value to the divider 50. If neither comparator has a high output, a high will be generated by the NOR gate 74 and will cause the multiplexer 76 to couple the N value to the divider 50. In addition, the output of the NOR gate 74 will reset the transition counter 68 whenever a high is generated by either the comparator 70 or 72. The divider value of N, N+1 or N−1 coupled from the multiplexer 76 is loaded into the divider 50 by a pulse coupled to the load input through the delay circuit 56. The net effect is a phase locking action caused by adjusting the timing of the bit timing pulses by increasing or decreasing the time between timing pulses from the divider 50 to compensate for timing error. This is done by decreasing or increasing the divide ratio (N) by 1 when correction is needed.

It should be noted that the subtract loop pulse (i.e., the Q output of the flip-flop 54) is at the edge of the bit when the loop is phase locked as can be seen in FIG. 4. This signal is coupled to the synchronized register 80 and to the D flip-flop 86. Referring back to the demodulation buffer 44, the demodulated base band samples from the exclusive OR gate 28 of FIG. 1A are left shifted into the demodulation buffer 44 of FIG. 1B by the add loop pulses coupled from the flip-flop 38 of FIG. 1A to the clock input of the demodulation buffer 44. Thus, the demodulation buffer 44 contains the demodulated base band samples and in the preferred embodiment, will contain N+2 samples (N equals the number of half cycles per bit). The samples of the demodulation buffer are coupled, as shown, to a carrier synchronizer register 46 made up of a parallel shift register of N+2 bits in the preferred embodiment. The contents of the demodulation buffer 44 are coupled in parallel to the register 46 and shifted right by the add loop pulses from the flip-flop 38. This is required because the bit edge occurs during the carrier sub-loop but the bit loop gets its timing only from the carrier add loop resulting in a jitter in the sample edge. Thus, after a carrier add loop a shift right is needed which eliminates a sample. Thus, the bit sub loop pulse will load the contents (N+1 samples in the preferred embodiment) of the carrier synchronizer register 46 into the synchronize register 80 at the bit edge. This is done because the bit sub-loop pulse is at the edge of the bit when the system is in lock. The N least significant samples of the synchronized register 80 are then applied to a conventional majority logic circuit 84 which in the preferred embodiment is a three out of five majority logic circuit. This integrates the samples and generates a detected bit output at the output 88 of the majority logic circuit 84. This output is then coupled to a latch 86 which is clocked, as shown, by the bit sub loop pulses. The result is the detected bits at the output 90 of the latch 86.

Referring now to FIG. 2, there is illustrated a bit data operated squelch (DOS) circuit which can be used in conjunction with the demodulator and detector of FIGS. 1A and 1B. The synchronization register 80 of FIG. 1B is shown and the inventive DOS is coupled to the register 80 via the terminal 82 (also shown in FIG. 1B.) Thus the contents of the synchronization register 80 is coupled, as shown, to a logic circuit composed of an AND gate 94, NOR gates 96, 98 and an exclusive OR gate 100. The middle three bits are coupled to the AND gate 94 and to the NOR gate 96, and the outputs of both gates are coupled to the NOR gate 98, as shown. The output of the NOR gate 98 is coupled to the decrement input 102 of a counter 104. The two most significant bits of the register 80 are coupled to the exclusive OR gate 100 and the output of the exclusive OR gate 100 is coupled to the increment input 106 of the counter 104, as shown. In addition, the bit sub loop pulses from the terminal 92 of FIG. 1 are coupled to the clock input of the counter 104. The output of the counter 104 is coupled to a comparator 108, a comparator 110, and a comparator 112, as shown. Therefore, if the two most significant bits are different, indicating a transition and therefore indicating bit lock, then the counter will be incremented when a bit sub loop pulse occurs. In addition, if the middle three bits are the same, indicating bit lock, the output of the NOR gate 92 will be low and the counter 104 will not change. However, if the middle three bits are not the same, then the bit edge may have occurred there, indicating an unlocked condition, the output of the NOR gate 98 will be high and the counter will be decremented by two upon the occurrence of the bit sub loop pulse. The comparator 108 prevents the counter 104 from underflowing by resetting to zero whenever the counter contents becomes less than zero, while the comparator 110 prevents the counter 104 from overflowing by loading a maximum value (d) whenever the contents of the counter 104 exceeds the maximum value (d). The count (i) of the counter 104 is also compared to one of two thresholds (Z) by the comparator 112. If the count (i) is greater than or equal to the threshold, a high output will be generated by the comparator 112 on the output 114 indicating that bit lock exists. This high can then be used for example, as a control signal to mute the receiver. The output 114 is also coupled directly to the $d_2$ input of the multiplexer 116 and through an inverter 118 to the $d_1$ input of the multiplexer 116. The output of the inverter 118 can also be used to unmute the receiver. The two data registers 119 and 120 are also coupled to the multiplexer 116, as shown. This circuit configuration adjusts the attack time versus falsing and the sensitivity by providing hysteresis. When the system is started up, the high threshold ($d_1$) is loaded because the output of the comparator 112 is low. However, once the high threshold has been reached, the output 114 goes high which causes the multiplexer 116 to load the lower threshold ($d_2$) into the comparator 112. This lowers the threshold increasing sensitivity. Conversely, if the count drops below the lower threshold ($d_2$) the output of the inverter 118 will be high, causing the high threshold ($d_1$) to be loaded by the multiplexer 116 into the comparator 112. Typical values used are a high threshold ($d_1$) of 20 and a low threshold ($d_2$) of 10. An alternative structure provides an increment signal to the counter 104 whenever all three middle bits are the same. This can be implemented by adding an inverter from the output of the NOR gate 98 to an increment input of the counter 104. With either configuration a highly stable bit data operated squelch is provided which operates by sensing transitions at the boundary and the middle of the bit.

Referring now to FIG. 3, there is shown the inventive carrier data operated squelch which can operate in conjunction with the demodulator and detector of FIG. 1A and B. The limited signal from terminal 15 (see FIG. 1A) is coupled, as shown, to the input of a sampler 130 and to an exclusive OR gate 132. Early clock pulses from the terminal 19 (see FIG. 1A) are coupled to the clock input of the sampler 130 and delayed clock pulses from the terminal 39 (see FIG. 1A) are coupled to an AND gate 134, as shown in FIG. 3. In addition, bit sub loop timing pulses from the terminal 92 (see FIG. 1B) are coupled to the AND gate 134 of FIG. 3. The early clock pulses cause the sampler 130 to sample the limited signal, thus providing early samples. These samples are then compared in the exclusive OR gate 132 with late samples, coupled from the terminal 15. If they are different, indicating a transition, a high signal is coupled to the control input of the counter 136, and a low is coupled to the counter 136 if they are the same. The counter 136 is clocked by the positive edge of a clock pulse coupled to the clock input. This clock pulse is generated when the delayed clock from the terminal 39 and the bit sub loop pulse from the terminal 92 both go high, enabling the AND gate 134. Thus, the counter 136 is incremented at a transition and the counter 136 is decremented for no transition, whenever the sub loop pulse occurs. The count total (m) output of the counter 136 is coupled to comparators 140, 142, 144, and 146, as shown. The comparator 140 prevents the counter 136 from underflowing by resetting it to zero whenever the count is less than zero. Similarly, the comparator 142 prevents the counter from overflowing by loading a maximum value ($d_1$) whenever the count exceeds the maximum value. The comparator 146 compares the count (m) to a predetermined threshold ($d_1$) and generates a high on the output 148 whenever the count exceeds the threshold. This high can then be used as a squelch control signal to mute the audio or control data steering functions. The output 148 is coupled to the S input of an RS flip-flop 150, while the output of the comparator 144 and a master reset are coupled to the R input of the flip-flop 150. The output 148 and the Q output of the flip-flop 150 are coupled to an AND gate 152, as shown. The output of the AND gate 152 is coupled to a load input of the counter 136. This configuration provides theshold hysteresis for the circuit by loading a large value (Z) into the counter whenever the count first exceeds the predetermined threshold ($d_2$), to eliminate chatter when the threshold is initially exceeded. The flip-flop 150 is reset by the comparator 144 when the count falls below a minimum reset value ($d_3$) less than the threshold value ($d_2$), or by a master reset pulse generated, for example, when the system is powered up.

FIG. 5 is a block diagram of the microprocessor implementation of the invention. A PSK signal is coupled from the receiver discriminator, (not shown), to the input 200 and bandpass filtered by a bandpass filter 202, as shown. The filter signal is squared up by hard limiting in a limiter 204, and the hard limiter signal is coupled to the input 205 of a CPU 206, which processes the signal. The CPU 206 may be a microprocessor (e.g. MC6801, or MC3870) which may also provide various other functions necessary for receiver operation. The CPU 206 is also coupled to a master oscillator 208, a random access memory (RAM) 210 and a read-only memory (ROM) 212. The master oscillator and memory may also be internal components of the microprocessor utilized for CPU 206. The CPU 206 also has a decoded output 209 and a DOS output 211 as shown in FIG. 5.

Figure 6:
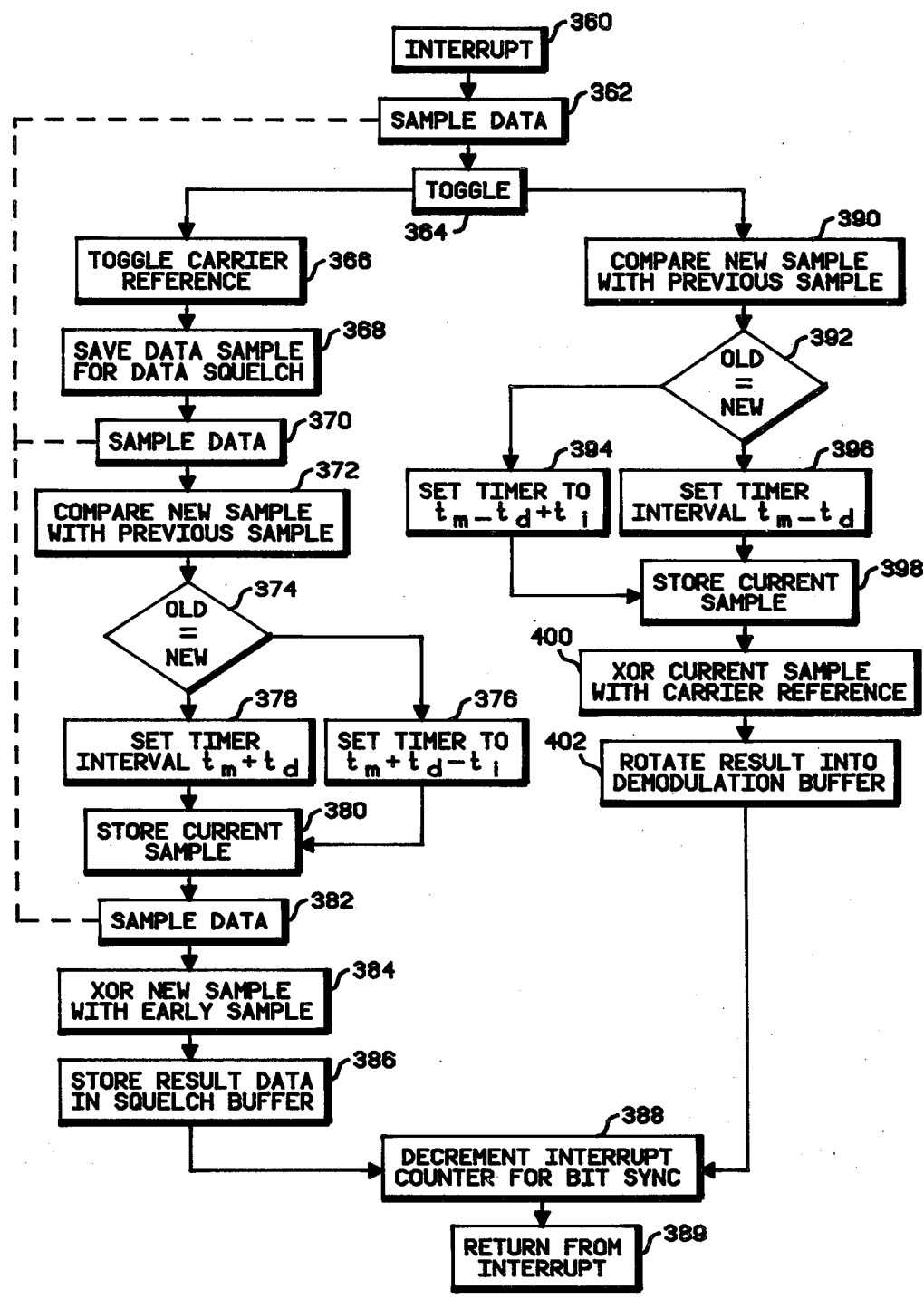
FIG. 6 is a flow diagram of the interrupt routine of the computer program for the invention.
Figure 7A:
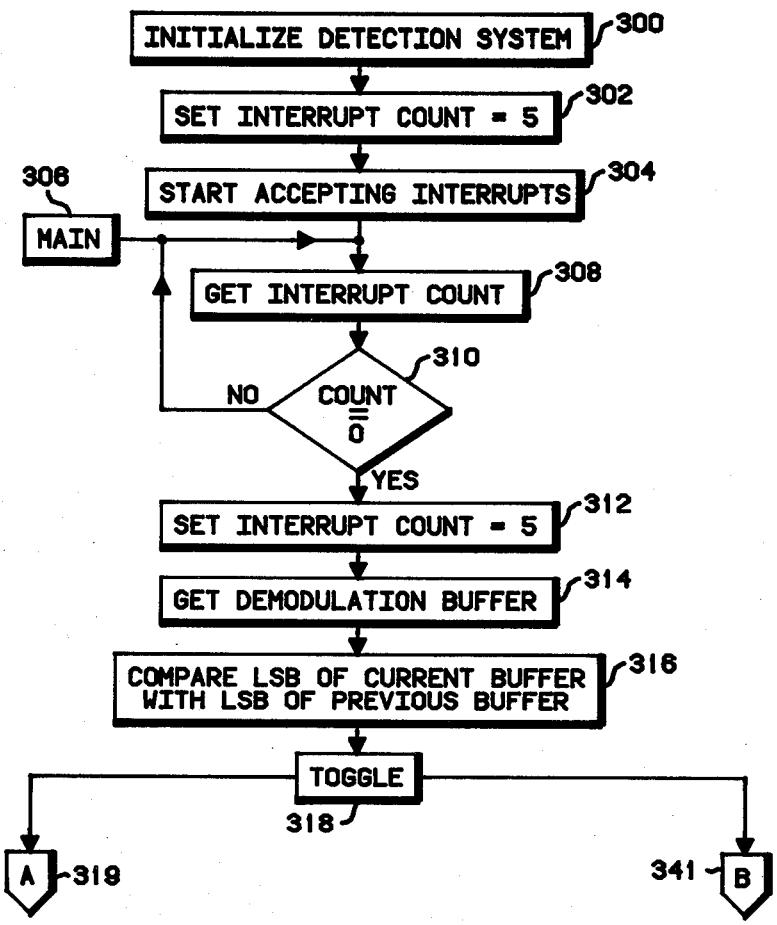
FIG. 7A is the first section of a flow diagram of the background routine of the computer program for the invention.
Figure 7B:
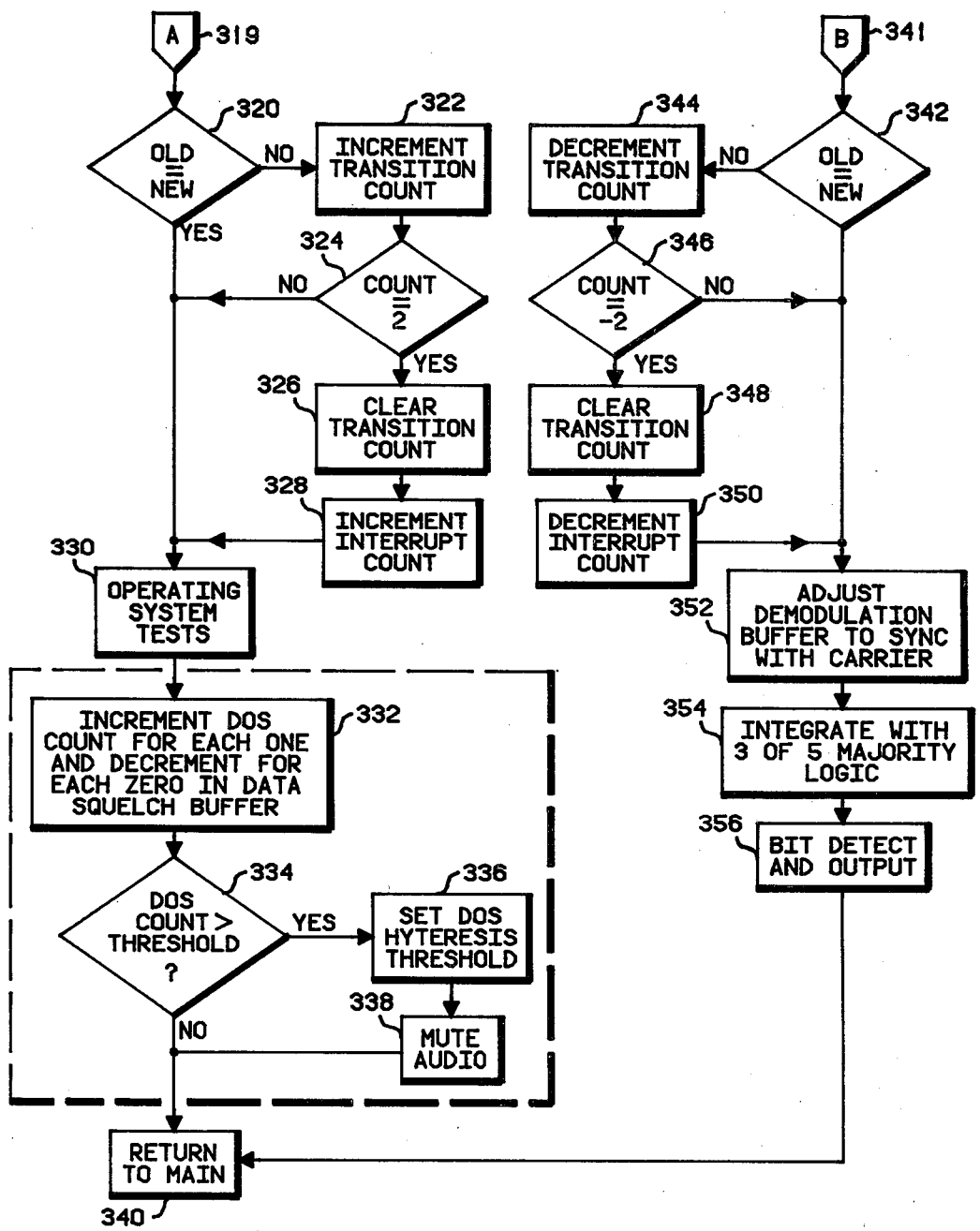
FIG. 7B is the final section of a flow diagram of the background routine of the computer program for the invention.

The flow charts of FIGS. 6, 7A and 7B are executed by the CPU 206 in processing the hard limited signal applied to the input 205 in accordance with the demodulator and detector in conjunction with the inventive carrier data operated squelch. FIGS. 7A and 7B show the background bit recovery routine for the demodulator and detector system utilizing carrier squelch. The program is initialized at block 300 of FIG. 7A which sets up the interrupt timer to provide the proper sample rate (with an interrupt interval of $t_m = 1/6$ Khz), and the timer interrupt counter is set to the number of half cycles per bit, (e.g., at five for the preferred embodiment) at block 302. Starting at block 304, timer interrupts are accepted, which will result in the CPU 206 performing the interrupt routine of FIG. 6 and then returning to the background routine at the point of the interrupt. The interrupt count is then obtained at block 308 and compared to zero at decision block 310. If the timer interrupt count is not zero, the program returns to block 308 thus waiting for additional interrupts thus providing a synchronizing mechanism. If the timer interrupt count is equal to zero, indicative of bit timing, the interrupt counter is reset to five at block 312 and the contents of the demodulation buffer are retrieved at 314 while the least significant bit of the demodulation buffer is compared with the previous least significant bit at 316. A divide by 2 operation occurs at 318 where the routine toggles to one of the two branches shown in FIG. 7B. If program flow toggles to block 319, corresponding to the add loop, then if the previous and current least significant bit of the sample buffer are not equal at block 320, indicating a transition, the transition count is incremented at 322. The transition count is then tested at decision block 324 and if equal to two, the transition count is cleared at 326 and the timer interrupt is incremented to six at block 328, thus adding time to the loop. The program then performs various operating system functions at block 330, which would be done immediately after block 320 if there were no transition and after block 324 if the transition count were not equal to two. The remainder of the routine is required only for the inventive carrier data operated squelch. The program proceeds to block 332 where the DOS count is incremented for each one and decremented for each zero in the data squelch buffer. The DOS count is then compared to a predetermined threshold at 334 (e.g., 20 in the preferred embodiment) and if it is greater than the threshold, a new threshold is set to provide desired hysteresis at 336. A high is then output on the DOS output 211 (see FIG. 5) to mute the audio at block 338. Program flow then returns to block 306, as shown at 340. If the DOS count is less than the threshold at decision block 334, then the program flow proceeds directly to block 306. Referring back to the toggle block 318 of FIG. 7A, on the next entry to the block 318, the program will proceed to block 341 of FIG. 7B and then to decision block 342. If the current and previous least significant bit of the demodulation buffer are not equal, indicating a transition, then the transition count will proceed be decremented as shown at block 344. The transition count is then tested at decision block 346 to determine if it is equal to −2. If the transition count is equal to −2, the transition count is cleared at 348, and the interrupt counter is decremented to four at block 350 thus subtracting time from the loop. The demodulation buffer is then shifted right one bit to synchronize with the carrier at block 352. The program flow will proceed directly to block 352 if the samples are equal at block 342 or if the transition count is not equal to −2 at block 346. After block 352, the contents of the demodulation buffer are integrated using three by five majority logic at 354 and then the detected bit is output to the decoded bit output 209 (see FIG. 5), at block 356. Program flow then returns to block 306 of FIG. 7A as indicated at block 340.

Referring now to FIG. 6, the carrier recovery interrupt routine is shown. The timer interrupt frequency is set to six kilohertz. The interrupt routine is entered at block 360 in response to a timer interrupt, as shown. A data sample, which serves as an "early" sample, is taken and stored at block 362 and the routine then toggles to one of two branches at block 364. If the program toggles to block 366, corresponding to the subtract increment loop, the internal carrier reference is toggled, establishing the recovered carrier, and then the data sample is stored for the DOS at block 368. An additional data sample is then taken at 370, at a time $t_d$ after the early sample and is used for the phase locked loop operation ($t_d$ is ½ the DOS window time). This sample is then compared to the sample stored on the previous interrupt as indicated at 372. If found not equal at block 374, indicating a transition, a correction increment ($t_i$ approximately 8.33 s. in the preferred embodiment) is subtracted from the timer at 376 adjusting the next interrupt to occur sooner thus bringing the sample point in phase with the signal. If the samples are the same at 374, the timer is set ($t_m + t_d$) without a correction at 378. In either case the current sample is stored at block 380 for the next test at 372. A new sample is then taken ($t_d$ after phase locked loop sample), to serve only as a "late" sample for the DOS, at 382. The latest sample is then exclusive OR'd at block 384 for the DOS with the "early" stored sample. If they are the same, indicating no transition, a zero is stored in the data squelch buffer and if they are different, a one is stored in the data squelch buffer, as indicated at block 386. The timer interrupt counter is then decremented at 388 and the routine returns from the interrupt to the routine of FIGS. 7A and 7B. The next timer interrupt will cause the routine of FIG. 6 to be entered again at 360 and an "early" sample will immediately be taken at 362. This time the program will toggle at 364 to the add increment loop at block 390 where the new sample is compared to the previous sample. If the new sample is not equal to the previous sample, as indicated at 392, program flow proceeds to 394, where the interrupt time is adjusted by adding a time increment ($t_i$). If the samples are equal, the timer will not be corrected, as indicated at 396. In either case, the current sample is stored at block 398, and the current sample is then exclusive OR'd with the carrier reference at block 400 to produce the baseband data. The result is stored in the demodulation buffer as indicated at 402. The interrupt counter is then decremented at 388 and program flow returns to the routine of FIGS. 7A and 7B as indicated at block 389.

Figure 8:
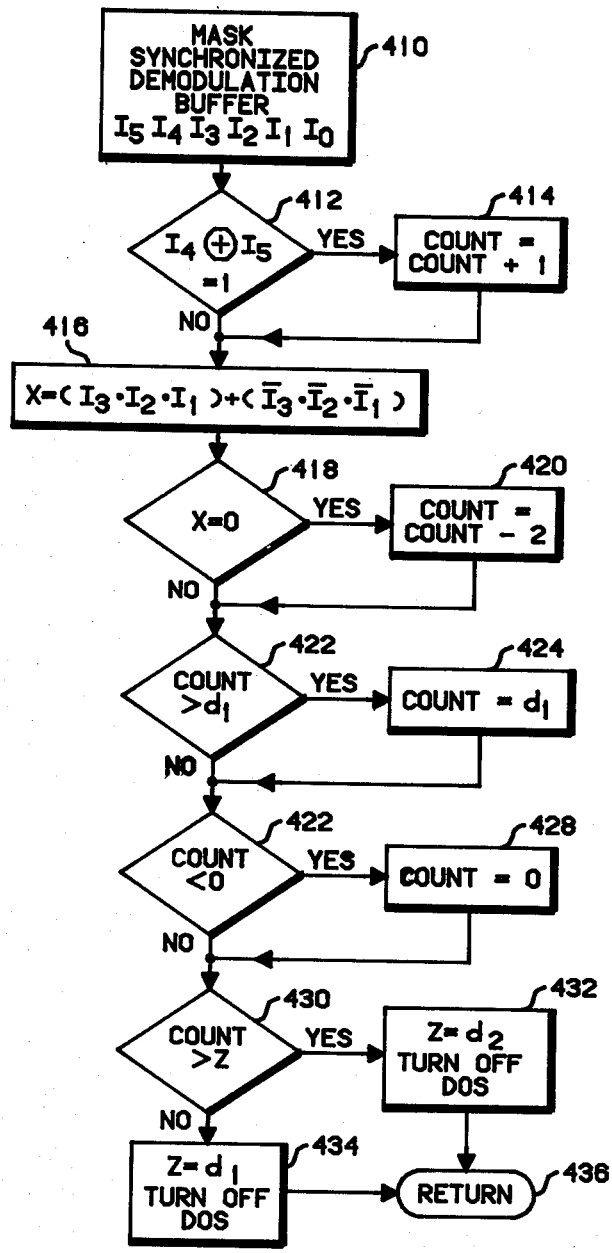
FIG. 8 is a flow diagram of the data operated squelch routine of the computer program for the invention.

FIG. 8 is a flow chart of the computer program for a bit data operated squelch for use in conjunction with the demodulation and detection system of FIG. 5. The routine shown in FIG. 8 could be integrated with the program of FIG. 7B after block 352. The contents of the synchronized demodulation buffer are masked at 410 to obtain the two most significant bits (I5, I4) and the middle three bits (I3, I2, I1). At block 312, the two most significant bits are exclusive OR'd with each other and the result is compared to one. If equal to one, indicating a transition, the count is incremented its indicated at 414 and then the program proceeds to block 416. If the exclusive OR result is zero, the middle three bits are then tested to determine if they are all the same as indicated at block 416 and 418. If they are not the same, the variable COUNT is decremented by two, as indicated at block 420. COUNT is then compared at 422 to a maximum value ($d_1$) and if COUNT exceeds the maximum value it is set equal to that value at 424 to prevent overflow. The variable COUNT is then tested to determine if it is less than zero at 426 and if it is, the count is set equal to zero as shown at block 428. The program flow then proceeds to block 430 where the COUNT is compared to a predetermined threshold (Z) equal to the maximum value. If COUNT is greater than the initial predetermined threshold, the threshold is set to a new lower threshold ($d_2$) and the DOS output 211 (see FIG. 5) is set high at block 432. If the count is less than the predetermined threshold then the DOS output 211 is set low, and the predetermined threshold is set to the maximum value ($d_1$) at block 434. In either case, the DOS routine returns to the normal flow of the program at 436.

In summary, an inventive carrier data operated squelch as well as a compatible coherent PSK signal demodulator and detector have been described. The inventive carrier data operated squelch can be implemented by apparatus utilizing conventional electrical circuit components or by process steps performed by an interrupt driven microcomputer. When implemented with a microcomputer such as a Motorola MC6801 type, the process steps of the present invention require only part of the microcomputer's execution time, thus freeing much of the microcomputer's execution time for other functions. The carrier data operated squelch of the present invention may be advantageously utilized in any suitable data communications system, such as, for example, a communication system where it is desirable to transmit PSK data signals between a central station and a plurality of mobile or fixed remote stations.

While a preferred embodiment of the invention has been described and shown, it should be understood that other variations and modifications may be implemented. It is therefore contemplated to cover by the present application any and all modifications and variations that fall within the true spirit and scope of the basic underlined principles disclosed and claimed herein.

What is claimed is:

1. A carrier data operated squelch circuit for use with a demodulator detector for phase shift keyed (PSK) encoded digital signals, which provides carrier clock pulses synchronized to the carrier, delayed carried clock pulses, and bit clock pulses synchronized to the edge of the bits of the digital signal, said carrier data operated squelch comprising:

limiting means, for hard limiting the PSK encoded digital signal;

early sampling means, coupled to the limiting means, for storing an early sample of the limited signal;

transition detection means, coupled to the limiting means and the early sampling means, for generating a transition signal if the current hard limited signal is different from the stored early sample;

counter means, coupled to the transition detection means, for accumulating a count by incrementing in response to detection of a transition signal and a bit clock pulse occurring concurrently with a delayed carrier clock pulse, and by decrementing in response to the absence of detection of a transition signal when a bit clock pulse occurs concurrently with a delayed carrier clock pulse; and first comparator means, coupled to the counter means, for generating a squelch control signal in response to the count exceeding a predetermined threshold.

2. The carrier data operated squelch of claim 1 further comprising second comparator means for resetting the count to zero whenever the count falls below zero.

3. The carrier data operated squelch of claim 2 further comprising third comparator means for loading a predetermined maximum value into the counter means in response to the count exceeding the predetermined maximum value.

4. The carrier data operated squelch of claim 3 further comprising hysteresis means coupled to the counter means, for loading a predetermined large value into the counter means in response to the count first exceeding the predetermined threshold.

5. The carrier data operated squelch of claim 4 where in the hysteresis means further comprising reset comparator means, for loading the predetermined large value into the counter means in response to the count exceeding the predetermined threshold after having first exceeded the predetermined threshold and then dropping below or lower predetermined reset threshold.

6. A method for carrier lock detection in a communications system utilizing a demodulator detector for phase shift keyed (PSK) encoded digital signals, which provides carrier clock pulses synchronized to the carrier and bit clock pulses synchronized to the edge of the bits of the digital signal, said method comprising the steps of:

hard limiting the PSK encoded digital signal;

storing an early sample of the limited digital signal in response to the carrier clock pulses;

generating a transition signal if the current hard limited signal is different from the stored early sample;

generated carrier clock pulses delayed by a predetermined time period;

incrementing a counter in response to detection of a transition signal and a bit clock pulse occurring concurrently with a delayed carrier clock pulse;

decrementing the counter in response to the absence of detection of a transition signal when a bit clock pulse is detected concurrently with a delayed carrier clock pulse; and generating a squelch control signal in response to the counter contents exceeding a first predetermined threshold.

7. The method of claim 6 further comprising the step of resetting the counter to zero whenever the count falls below zero.

8. The method of claim 7 further comprising the step of loading a predetermined maximum value into the counter in response to the counter contents exceeding the predetermined maximum value.

9. The method of claim 8 further comprising the step of loading a predetermined large value into the counter in response to the counter contents first exceeding the predetermined threshold.

10. The method of claim 9 further comprising the step of loading the predetermined large value into the counter in response to the counter contents exceeding the predetermined threshold after having first exceeded the predetermined threshold and then dropping below a lower predetermined reset threshold.

* * * * *